(12) United States Patent
Sun et al.

(10) Patent No.: US 11,810,982 B2
(45) Date of Patent: Nov. 7, 2023

(54) NONVOLATILE MEMORY DEVICE WITH A DOPED REGION BETWEEN A SOURCE AND A DRAIN AND INTEGRATION SCHEMES

(71) Applicant: GLOBALFOUNDRIES Singapore Pte. Ltd., Singapore (SG)

(72) Inventors: Yongshun Sun, Singapore (SG); Shyue Seng Tan, Singapore (SG); Eng Huat Toh, Singapore (SG); Xinshu Cai, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 17/391,031

(22) Filed: Aug. 2, 2021

(65) Prior Publication Data

US 2023/0029507 A1 Feb. 2, 2023

(51) Int. Cl.
*H01L 29/788* (2006.01)
*H01L 29/66* (2006.01)
*H01L 29/10* (2006.01)
*H01L 29/161* (2006.01)

(52) U.S. Cl.
CPC ...... *H01L 29/7883* (2013.01); *H01L 29/1083* (2013.01); *H01L 29/161* (2013.01); *H01L 29/66825* (2013.01)

(58) Field of Classification Search
CPC ............. H01L 29/7883; H01L 29/1083; H01L 29/161; H01L 29/66825; H01L 27/11517–1156; H01L 29/42324–42336; H01L 29/788–7889; H01L 29/7833–7836; H01L 29/1041–1045; G11C 16/0408–0458; G11C 11/5621–5642; G11C 2216/06–10; H10B 12/20; H10B 41/47; H10B 41/00–70; H10B 41/30
See application file for complete search history.

(56) References Cited

U.S. PATENT DOCUMENTS

| | | | |
|---|---|---|---|
| 6,207,989 B1 | 3/2001 | Li et al. | |
| 6,563,151 B1* | 5/2003 | Shin | H01L 29/4983 257/E29.264 |
| 6,713,812 B1* | 3/2004 | Hoefler | H01L 29/792 257/E29.055 |
| 7,099,192 B2 | 8/2006 | Wang et al. | |
| 2007/0145467 A1 | 6/2007 | Park et al. | |
| 2013/0026553 A1* | 1/2013 | Horch | H01L 29/513 438/257 |
| 2013/0328117 A1 | 12/2013 | Hommelgaard et al. | |
| 2017/0352676 A1* | 12/2017 | Ogata | H01L 29/7831 |
| 2019/0198617 A1* | 6/2019 | Li | H01L 29/40114 |

FOREIGN PATENT DOCUMENTS

WO 2008042591 A2 4/2008

* cited by examiner

*Primary Examiner* — Shahed Ahmed
(74) *Attorney, Agent, or Firm* — David Cain (57) ABSTRACT

A nonvolatile memory device is provided. The nonvolatile memory device comprises an n-doped source, an n-doped drain, and a doped region in a first p-well in a substrate. A floating gate may be arranged over the first p-well, whereby the doped region may be arranged at least partially under the floating gate.

21 Claims, 4 Drawing Sheets

FIG. 8

NONVOLATILE MEMORY DEVICE WITH A DOPED REGION BETWEEN A SOURCE AND A DRAIN AND INTEGRATION SCHEMES

FIELD OF THE INVENTION

The disclosed embodiments relate generally to nonvolatile memory devices, and more particularly, to nonvolatile memory devices with a doped region between a source and a drain and integration schemes.

BACKGROUND

A nonvolatile memory device retains stored charges even if power is turned off. An example of a nonvolatile memory device includes flash EEPROM. In typical flash memory architecture, a floating gate may be used to store charges. The floating gate may be arranged over an active region such as a p-well arranged in a substrate. The floating gate may extend over an n-well adjacent to the p-well to form an n-well capacitor. The n-well capacitor may be used to bias the floating gate through capacitive coupling as the floating gate is electrically insulated from external input nodes.

Programming the memory device may result in storage of electrons in the floating gate. During programming, a high voltage may be applied to the floating gate through the n-well capacitor and to a drain of the memory device. A lower voltage may be applied to a source of the memory device and the substrate may be grounded. A strong vertically oriented electric field in a channel region between the source and the drain may be created resulting in injection of hot electrons to an edge portion of the floating gate from the channel region. The high voltage needed for programming is undesirable as it consumes a lot of power. Thus, there is a need for an improved memory device to overcome the challenges mentioned above.

SUMMARY

In an aspect of the present disclosure, a nonvolatile memory device is provided. The nonvolatile memory device comprises a floating gate over a first p-well in a substrate. An n-doped source, an n-doped drain, and a doped region may be arranged in the first p-well, whereby the doped region may be arranged at least partially under the floating gate.

In another aspect of the present disclosure, a nonvolatile memory device is provided. The nonvolatile memory device comprises a floating gate over a first p-well in a silicon substrate. An n-doped source, an n-doped drain, halo regions adjacent to the n-doped source and the n-doped drain, and a doped region may be arranged in the first p-well, whereby the doped region may be arranged adjacent to a top surface of the first p-well between the n-doped source and the n-doped drain.

In yet another aspect of the present disclosure, a method of fabricating a nonvolatile memory device is provided. The method comprises forming a doped region in a first p-well in a substrate. A floating gate may be formed over the first p-well, whereby the doped region may be arranged at least partially under the floating gate. An n-doped source and an n-doped drain may be formed in the first p-well.

Numerous advantages may be derived from the embodiments described below. The embodiments provide a nonvolatile memory device with a higher programming efficiency as the doped region enhances impact ionization and hot electron injection to the floating gate. A lower programming voltage may be used to achieve a large threshold voltage window and higher device reliability may be achieved.

BRIEF DESCRIPTION OF THE DRAWINGS

The disclosed embodiments will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1:
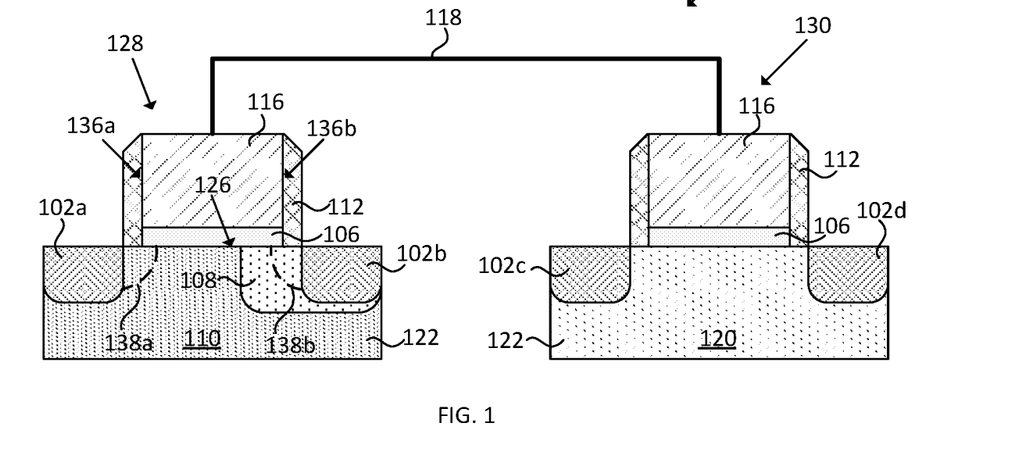
FIG. 1 illustrates a cross-section view of a nonvolatile memory device, according to an embodiment of the disclosure.

FIG. 1 illustrates a cross-section view of a nonvolatile memory device 100, according to an embodiment of the disclosure. The nonvolatile memory device 100 includes a memory transistor 128 which may include a first p-well 110 arranged in a substrate 122. In one embodiment, the substrate 122 may be made of a suitable semiconductor material, for example, silicon. A source 102a may be arranged in the first p-well 110. A doped region may be arranged in the first p-well 110 and spaced from the source 102a, whereby the doped region may be a second p-well 108. In one embodiment, the second p-well 108 may have a higher dopant concentration than the first p-well 110. A drain 102b may be arranged in the first p-well 110 and adjacent to the second p-well 108. In one embodiment, the source 102a and the drain 102b are n-doped or n+ doped. In a preferred embodiment, the second p-well 108 may have a lower dopant concentration than the source 102a and the drain 102b. For example, the second p-well 108 may have a dopant concentration in the range of $10^{17}$ to $10^{18}$ cm$^{-3}$, the source 102a and the drain 102b may have a dopant concentration of approximately $10^{20}$ cm$^{-3}$, the first p-well 110 may have a dopant concentration in the range of $10^{16}$ to $10^{17}$ cm$^{-3}$. The second p-well 108 may be arranged adjacent to a top surface 126 of the first p-well 110 between the source 102a and the drain 102b. In one embodiment, the second p-well 108 may extend to a portion of a channel region between the source 102a and the drain 102b. The other portion of the channel region may include the first p-well 110. The channel region may refer to a portion of the substrate 122 between the source 102a and the drain 102b where carriers are generated when a bias is applied during the device 100 operation. In one embodiment, the second p-well 108 may be shallower than the first p-well 110. For example, the second p-well 108 may be arranged in an upper portion of the first p-well 110. The upper portion of the first p-well 110 may refer to the portion housing the source 102a and the drain 102b. In one embodiment, the second p-well 108 may be arranged next to a side surface of the drain 102b and may be between the source 102a and the drain 102b. In one embodiment, the second p-well 108 may extend below a bottom surface of the drain 102b.

Halo regions 138a and 138b may be arranged adjacent to the source 102a and the drain 102b, respectively, whereby the halo regions 138a and 138b may be p-doped. The halo regions 138a and 138b may have a dopant concentration higher than the first p-well 110. For example, the halo regions 138a and 138b may have a dopant concentration in the range of $10^{17}$ to $10^{18}$ cm$^{-3}$. In one embodiment, the second p-well 108 may overlap the halo region 138b. For example, a portion of the second p-well 108 may extend beyond the halo region 138b and may be deeper than the halo region 138b. A portion where the second p-well 108 overlaps the halo region 138b, indicated by a dashed outline, may be more highly doped than either the second p-well 108 or the halo region 138b as the dopants of the halo region 138b are added to the dopants of the second p-well 108. For example, the second p-well 108 and the halo region 138b may each have a dopant concentration of approximately $10^{18}$ cm$^{-3}$. The portion where the second p-well 108 overlaps the halo region 138b may have a dopant concentration of approximately 2 times $10^{18}$ cm$^{-3}$. The halo regions 138a and 138b may reduce short channel effect and off current leakage.

A floating gate 116 may be arranged above the substrate 122. The term "floating gate" may refer to a gate electrode that is electrically isolated from an input terminal and may be capacitively coupled to the input terminal. There may not be direct current flowing from the input terminal to the floating gate 116 during a reading operation. The source 102a may be adjacent to and laterally displaced from a first side 136a of the floating gate 116 and the drain 102b may be adjacent to and laterally displaced from a second side 136b of the floating gate 116 opposite to the source 102a. The halo regions 138a and 138b may be arranged below the first side 136a and the second side 136b, respectively. Although not shown, in one embodiment, the source 102a may be connected to a ground line while the drain 102b may be connected to a high voltage metal line. The second p-well 108 may be arranged below a portion of the floating gate 116 and the first p-well 110 may be arranged below the other portion of the floating gate 116. A tunnel dielectric 106 may be arranged between the floating gate 116 and the substrate 122. The tunnel dielectric 106 may be made of silicon dioxide. Spacer structures 112 may be arranged over side surfaces of the floating gate 116 and the tunnel dielectric 106. The spacer structures 112 may be made of a suitable dielectric material, for example, silicon dioxide, silicon nitride, silicon oxynitride or any other suitable dielectric material.

The nonvolatile memory device 100 may include a capacitor 130 coupled to the memory transistor 128. A line 118 indicates an electrical connection between the capacitor 130 and the memory transistor 128. The capacitor 130 may include an n-well 120 arranged in the substrate 122. N+ doped regions 102c and 102d may be arranged in the n-well 120. The floating gate 116 may extend over the n-well 120 and the tunnel dielectric 106 may be arranged between the floating gate 116 and the n-well 120. N+ doped region 102c may be adjacent to and laterally displaced from a first side of the floating gate 116. N+ doped region 102d may be adjacent to and laterally displaced from a second side of the floating gate 116 opposite to the n+ doped region 102c. The n+ doped regions 102c and 102d may serve as an input terminal to the floating gate 116.

A possible operation of the nonvolatile memory device 100 is described below. During programming, a high voltage may be applied to the floating gate 116 through the n+ doped regions 102c and 102d. A high voltage may also be applied to the drain 102b. The source 102a and the first p-well 110 may be grounded. A strong vertically oriented electric field in the channel region between the source 102a and the drain 102b may be created. The highly doped second p-well 108 enhances impact ionization at the drain 102b resulting in injection of hot electrons to an edge portion of the floating gate 116 from the channel region. The term, "impact ionization" may refer to electron-hole pair generation due to energetic electrons or holes. The enhanced impact ionization improves programming efficiency of the nonvolatile memory device 100 resulting in lower programming voltage. A current generated in the channel between the source 102a and the drain 102b may be maintained as a portion of the channel includes the lower doped first p-well 110.

Figure 2:
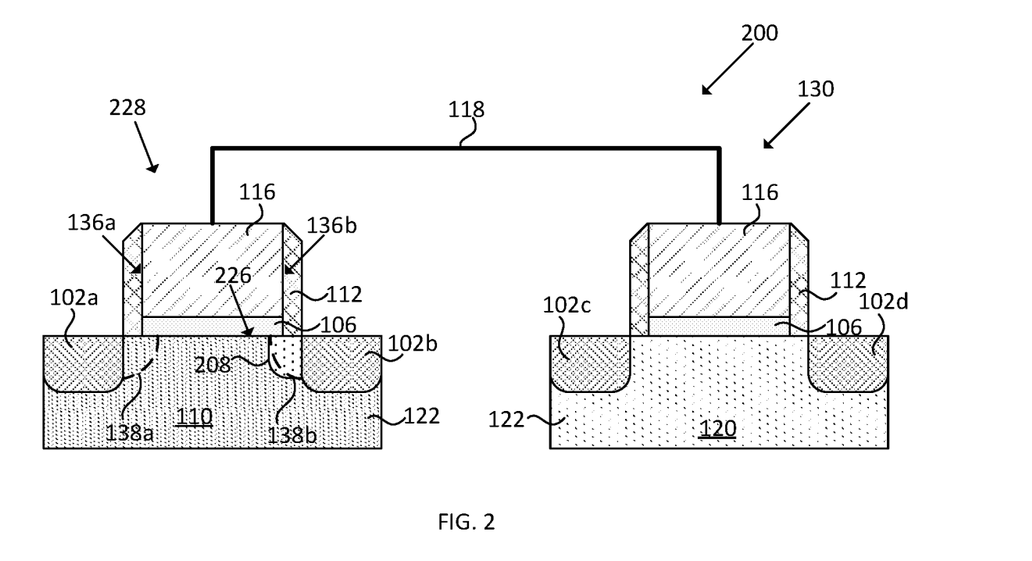
FIG. 2 illustrates a cross-section view of a nonvolatile memory device, according to another embodiment of the disclosure.

FIG. 2 illustrates a cross-section view of a nonvolatile memory device 200, according to another embodiment of the disclosure. Like reference numerals in FIG. 1 denote like features in FIG. 2. Referring to FIG. 2, in contrast to the nonvolatile memory device 100, the nonvolatile memory device 200 may include a memory transistor 228 having a doped region in the form of a p-doped halo region 208. The p-doped halo region 208 may be arranged adjacent to the drain 102b and spaced from the source 102a. In one embodiment, the p-doped halo region 208 may be arranged between the source 102a and the drain 102b. The p-doped halo region 208, the source 102a and the drain 102b may be arranged in the upper portion of the first p-well 110 in the substrate 122. In one embodiment, the p-doped halo region 208 may be arranged under a portion of the floating gate 116 and adjacent to a top surface 226 of the first p-well 110 between the source 102a and the drain 102b. The p-doped halo region 208 may at least partially overlap the halo region 138b. In one embodiment, the p-doped halo region 208 may completely overlap the halo region 138b. The p-doped halo region 208 may have a higher dopant concentration than the first p-well 110. A portion where the p-doped halo region 208 overlaps the halo region 138b, indicated as a dashed outline, may be more highly doped than either the halo region 138b or the p-doped halo region 208 as the dopants from the halo region 138b are added to the dopants from the p-doped halo region 208. For example, the p-doped halo region 208 and the halo region 138b may each have a dopant concentration of approximately $10^{18}$ cm$^{-3}$. The portion where the p-doped halo region 208 overlaps the halo region 138b may have a dopant concentration of approximately 2 times $10^{18}$ cm$^{-3}$. In one embodiment, the p-doped halo region 208 may extend to a portion of a channel region between the source 102a and the drain 102b. The other portion of the channel region may include the first p-well 110. The nonvolatile memory device 200 may include a capacitor 130, like the nonvolatile memory device 100.

The biasing conditions during programming of the nonvolatile memory device 200 is like the nonvolatile memory device 100. The highly doped p-doped halo region 208 increases impact ionization in the channel region proximal the drain region 102b and increases programming efficiency. Hot carrier generation and electron injection is localized near the drain region 102b. A current generated during the nonvolatile memory device 200 operation is not significantly affected as a portion of the channel region between the source 102a and the drain 102b includes the first p-well 110, which has a lower dopant concentration than the p-doped halo region 208. In a preferred embodiment, the p-doped halo region 208 may have a lower dopant concentration than the source 102a and the drain 102b. For example, the p-doped halo region 208 may have a similar dopant concentration as the second p-well 108. The p-doped halo region 208 may have a dopant concentration in the range of $10^{17}$ to $10^{18}$ cm$^{-3}$.

Figure 3:
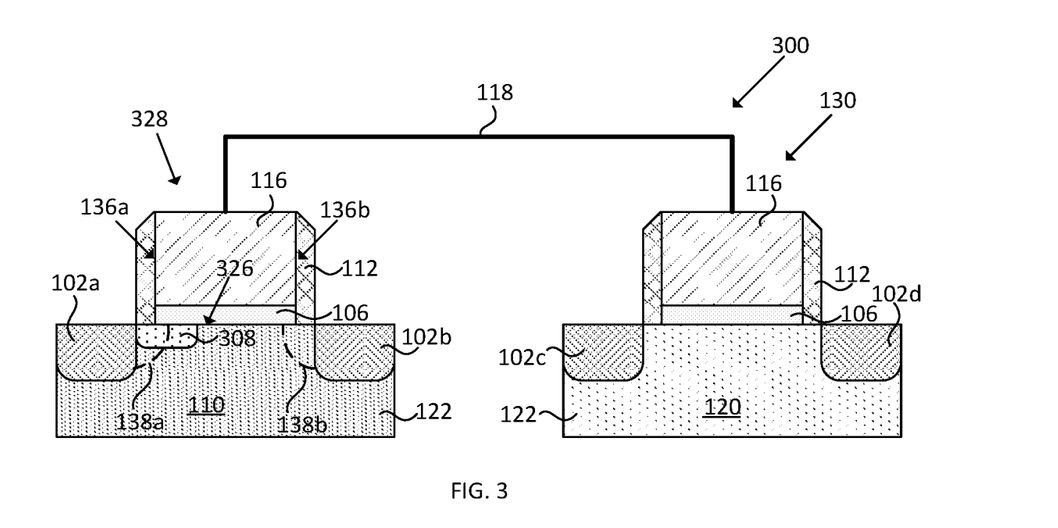
FIG. 3 illustrates a cross-section view of a nonvolatile memory device, according to yet another embodiment of the disclosure.

FIG. 3 illustrates a cross-section view of a nonvolatile memory device 300, according to yet another embodiment of the disclosure. Like reference numerals in FIG. 1 denote like features in FIG. 3. Referring to FIG. 3, in contrast to the nonvolatile memory device 100, the nonvolatile memory device 300 may include a memory transistor 328 having a doped region in the form of a p-doped silicon germanium region 308. The p-doped silicon germanium region 308 may be arranged adjacent to the source 102a and spaced from the drain 102b. A portion of the p-doped silicon germanium region 308 may at least partially overlap the halo region 138a and the other portion of the p-doped silicon germanium region 308 may be adjacent to the halo region 138a. The p-doped silicon germanium region 308, the source 102a and the drain 102b may be arranged in the first p-well 110 in the substrate 122. The p-doped silicon germanium region 308 may be adjacent to a top surface 326 of the first p-well 110 between the source 102a and the drain 102b and may be arranged between the source 102a and the drain 102b. In one embodiment, the p-doped silicon germanium region 308 may be arranged below a portion of the floating gate 116. The first p-well 110 may be arranged below the other portion of the floating gate 116. The p-doped silicon germanium region 308 may have a dopant concentration at least equal to or greater than a dopant concentration of the first p-well 110. The p-doped silicon germanium region 308 may have a dopant concentration in the range of $10^{16}$ to $10^{17}$ cm$^{-3}$. In a preferred embodiment, the p-doped silicon germanium region 308 may have a dopant concentration lower than the source 102a and the drain 102b. In one embodiment, the p-doped silicon germanium region 308 may extend to a portion of a channel region between the source 102a and the drain 102b. The other portion of the channel region may include the first p-well 110. The nonvolatile memory device 300 may also include a capacitor 130, like the nonvolatile memory device 100.

During programming of the nonvolatile memory device 300, a high voltage may be applied to the source 102a. A high voltage may also be applied to the floating gate 116 through the n+ doped regions 102c and 102d. The drain 102b and the first p-well 110 may be grounded. The biasing conditions of the source 102a and the drain 102b of the nonvolatile memory device 300 during programming is reversed compared to the nonvolatile memory device 100. A high electric field may be generated between the drain 102b and the source 102a, leading to impact ionization at the source 102a. The p-doped silicon germanium region 308 enhances impact ionization at the source 102a due to the smaller bandgap of the silicon germanium compared to silicon thereby increasing programming efficiency. Carriers may be subsequently injected to the floating gate 116 at the source 102a using a lower programming voltage.

During a read operation, a read voltage may be applied to the drain 102b. The read voltage may also be applied to the floating gate 116 through the n+ doped regions 102c and 102d. The first p-well 110 and the source 102a may be grounded. The junction leakage during the read operation is not affected by the p-doped silicon germanium region 308 as the source 102a is grounded.

Figure 4:
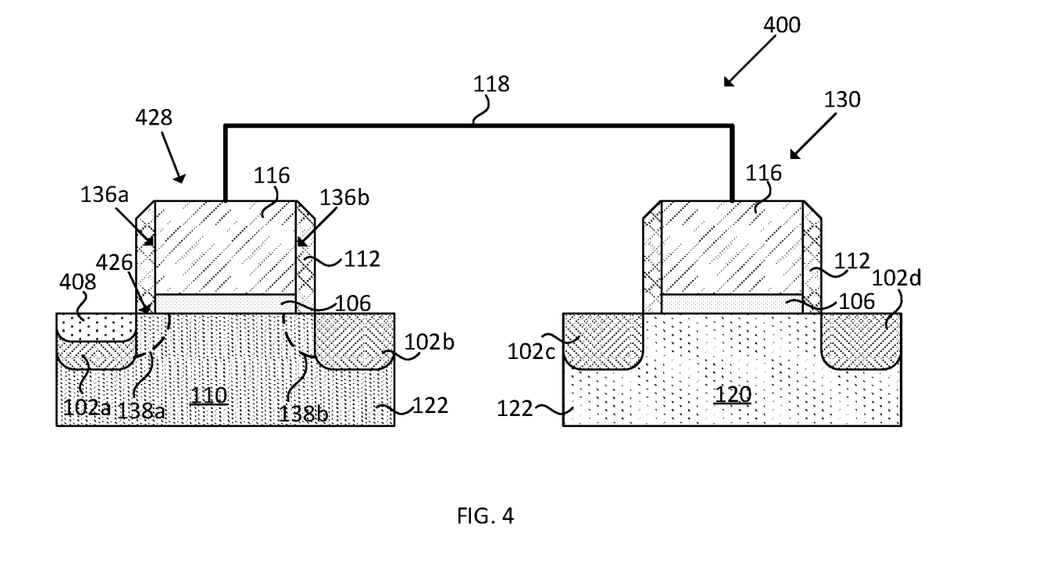
FIG. 4 illustrates a cross-section view of a nonvolatile memory device, according to yet another embodiment of the disclosure.

FIG. 4 illustrates a cross-section view of a nonvolatile memory device 400, according to yet another embodiment of the disclosure. Like reference numerals in FIG. 1 denote like features in FIG. 4. Referring to FIG. 4, in contrast to the nonvolatile memory device 100, the nonvolatile memory device 400 may include a memory transistor 428 having a doped region in the form of an n+ doped silicon germanium region 408. The n+ doped silicon germanium region 408 may be arranged above the source 102a and adjacent to a top surface 426 of the first p-well 110 between the source 102a and the drain 102b. The source 102a, the n+ doped silicon germanium region 408, and the drain 102b may be arranged in the upper portion of the first p-well 110 in the substrate 122. The n+ doped silicon germanium region 408 may have at least the same dopant concentration as the source 102a. The n+ doped silicon germanium region 408 may have a dopant concentration of approximately $10^{20}$ cm$^{-3}$. The n+ doped silicon germanium region 408 may be arranged adjacent to the halo region 138a.

The tunnel dielectric layer 106 may be arranged over the substrate 122 and the floating gate 116 may be arranged over the tunnel dielectric layer 106. The n+ doped silicon germanium region 408 and the source 102a may be adjacent to and laterally displaced from a first side 136a of the floating gate 116. The drain 102b may be adjacent to and laterally displaced from a second side 136b of the floating gate 116 opposite to the source 102a and the n+ doped silicon germanium region 408. Like the nonvolatile memory device 100, the nonvolatile memory device 400 may include a capacitor 130.

During programming of the nonvolatile memory device 400, a high voltage may be applied to the n+ doped silicon germanium region 408 and the source 102a. A high voltage may also be applied to the floating gate 116 through the n+ doped regions 102c and 102d. The drain 102b and the first p-well 110 may be grounded. A high electric field may be generated in a channel region between the n+ doped silicon germanium region 408, the source 102a, and the drain 102b. The n+ doped silicon germanium region 408 increases hot carrier generation due to impact ionization near the source 102a. The enhanced impact ionization may be due to the smaller band gap of silicon germanium as compared to silicon. The generated carriers may be injected to the floating gate 116. Increased programming efficiency is achieved, and a lower programming voltage may be used.

Figure 5:
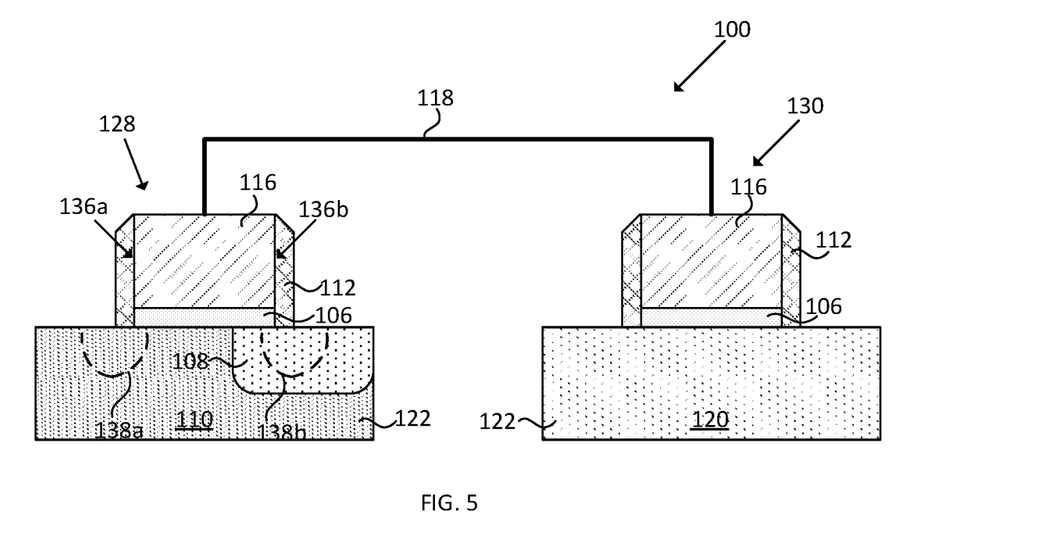
FIG. 5 illustrates a cross-section view of a partially completed nonvolatile memory device after formation of the first p-well, the second p-well, the n-well, the tunnel dielectric, the floating gate, the halo regions, and spacer structures, according to some embodiments of the disclosure.

During a read operation, a read voltage may be applied to the drain 102b and to the floating gate 116 through the n+ doped regions 102c and 102d. The n+ doped silicon germanium region 408, the source 102a and the first p-well 110 may be grounded. The junction leakage during the read operation is not affected by the n+ doped silicon germanium region 408 as it is grounded FIG. 5 illustrates a cross-section view of a partially completed nonvolatile memory device 100 after formation of the first p-well 110, the second p-well 108, the n-well 120, the tunnel dielectric 106, the floating gate 116, the halo regions 138a and 138b, and spacer structures 112, according to some embodiments of the disclosure. Referring to FIG. 5, the substrate 122 may be provided. The first p-well 110 may be formed in a portion of the substrate 122 and the n-well 120 may be formed in another portion of the substrate 122. The first p-well 110 may be fabricated by doping the substrate 122 with a suitable p-type dopant, for example, boron, gallium, indium, or any other suitable dopants. The second p-well 108 may be formed in an upper portion of the first p-well 110. The second p-well 108 may be fabricated by doping the substrate 122 with a suitable p-type dopant, for example, boron, gallium, indium, or any other suitable dopants. The second p-well 108 may have a higher dopant concentration than the first p-well 110. The n-well 120 may be formed by doping the other portion of the substrate 122 with a suitable n-type dopant, for example, arsenic or phosphorus. A dielectric layer, for example, silicon dioxide, may be deposited over the substrate 122 and an n+ doped polysilicon layer may be deposited over the silicon dioxide layer. The n+ doped polysilicon layer and the silicon dioxide layer may be patterned to form the floating gate 116 and the tunnel dielectric 106, respectively, over the first p-well 110 and the n-well 120. The floating gate 116 may be formed above a portion of the second p-well 108. Another portion of the second p-well 108 may be adjacent to and laterally displaced from the second side 136b of the floating gate 116. Halo regions 138a and 138b may be formed in the first p-well 110 and under the first side 136a and the second side 136, respectively, of the floating gate 116. The halo regions 138a and 138b may be formed by doping with a suitable dopant, for example, boron or boron bifluoride (BF$_2$). The second p-well 108 may overlap the halo region 138b. Spacer structures 112 may be formed over side surfaces of the floating gate 116 and the tunnel dielectric 106.

The fabrication process continues to form the nonvolatile memory device 100 shown in FIG. 1. Referring to FIG. 1, the source 102a and the drain 102b may be formed in the first p-well 110 and the n+ doped regions 102c and 102d may be formed in the first n-well 120. The formation of the source 102a, the drain 102b and the n+ doped regions 102c and 102d may be by doping with a suitable n-type dopant, for example, phosphorus or arsenic. The source 102a may be adjacent to and laterally displaced from the first side 136a of the floating gate 116 and the drain 102b may be adjacent to and laterally displaced from the second side 136b of the floating gate 116 opposite to the source 102a. The second p-well 108 may be arranged between the source 102a and the drain 102b and may be arranged adjacent to the drain 102b.

Figure 6:
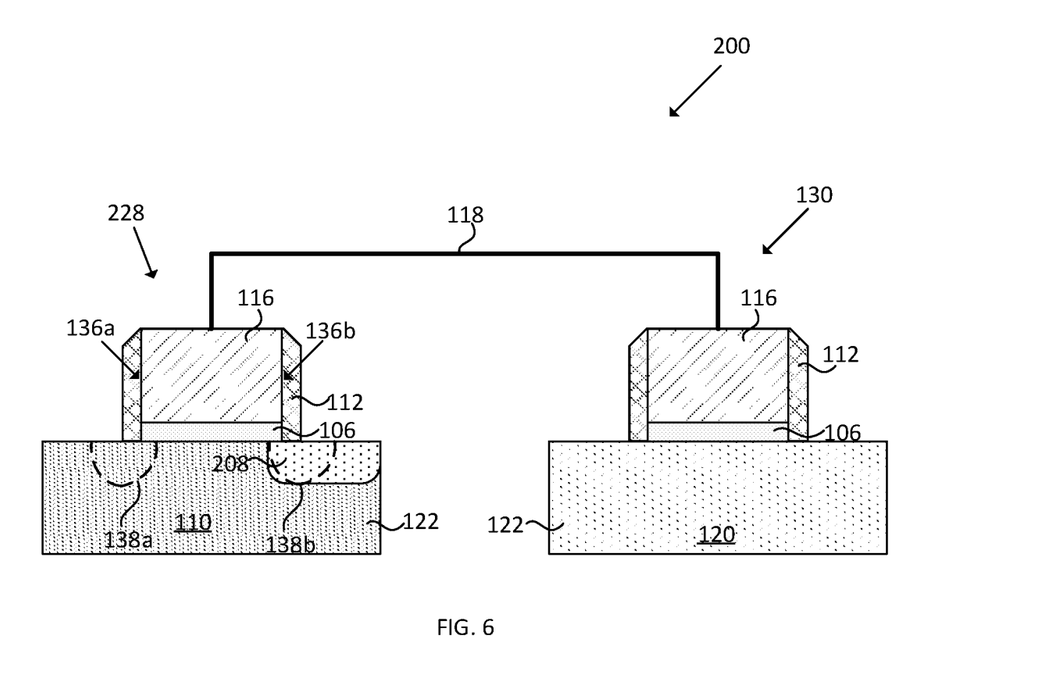
FIG. 6 illustrates a cross-section view of a partially completed nonvolatile memory device after formation of the first p-well, the p-doped halo region, the n-well, the tunnel dielectric, the floating gate, the halo regions, and spacer structures, according to some embodiments of the disclosure.

FIG. 6 illustrates a cross-section view of a partially completed nonvolatile memory device 200 after formation of the first p-well 110, the p-doped halo region 208, the n-well 120, the tunnel dielectric 106, the floating gate 116, the halo regions 138a and 138b, and spacer structures 112, according to some embodiments of the disclosure. Referring to FIG. 6, the formation of the first p-well 110, the n-well 120, the tunnel dielectric 106, the floating gate 116, and the halo regions 138a and 138b of the nonvolatile memory device 200 is similar to the fabrication process of the same features in the nonvolatile memory device 100. The p-doped halo region 208 may be formed after the formation of the floating gate 116 and the halo regions 138a and 138b by doping an upper portion of the first p-well 110 and extending to under a portion of the floating gate 116. In one embodiment, the p-doped halo region 208 may overlap the halo region 138b. A suitable p-type dopant, for example, boron, may be used for the doping process. The spacer structures 112 may be formed over side surfaces of the floating gate 116 and the tunnel dielectric 106. The formation of the spacer structures 112 may be like the fabrication process of the same features in the nonvolatile memory device 100.

The process continues to form the nonvolatile memory device 200 shown in FIG. 2. Referring to FIG. 2, The n+ doped regions 102c and 102d may be formed in the n-well 120, adjacent to the floating gate 116. The source 102a and the drain 102b may be formed in the first p-well 110, next to the floating gate 116. The formation of the n+ doped regions 102c and 102d, the source 102a and the drain 102b of the nonvolatile memory device 200 may be like the fabrication process of the same features in the nonvolatile memory device 100. The drain 102b may be formed adjacent to the p-doped halo region 208 and laterally displaced from the second side 136b of the floating gate 116. Thereby, the p-doped halo region 208 may be arranged between the source 102a and the drain 102b.

Figure 7:
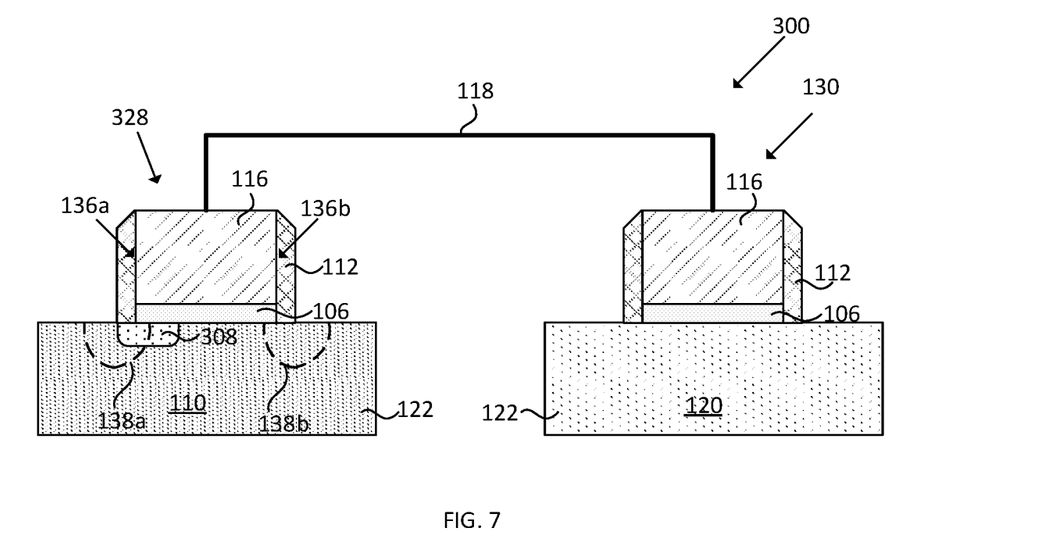
FIG. 7 illustrates a cross-section view of a partially completed nonvolatile memory device after formation of the first p-well, the p-doped silicon germanium region, the n-well, the tunnel dielectric, the floating gate, the halo regions, and spacer structures, according to some embodiments of the disclosure.

FIG. 7 illustrates a cross-section view of a partially completed nonvolatile memory device 300 after formation of the first p-well 110, the p-doped silicon germanium region 308, the n-well 120, the tunnel dielectric 106, the floating gate 116, the halo regions 138a and 138b, and spacer structures 112, according to some embodiments of the disclosure. Referring to FIG. 7, the formation of the first p-well 110 and the n-well 120 of the nonvolatile memory device 300 may be like the fabrication process of the same features of the nonvolatile memory device 100. The p-doped silicon germanium region 308 may be formed in an upper portion of the first p-well 110. The formation of the p-doped silicon germanium region 308 may include forming a sacrificial silicon dioxide layer over the substrate 122. A trench may be formed in the sacrificial silicon dioxide layer and an upper portion of the first p-well 110 by a wet etch or dry etch process. A silicon germanium layer may be formed in the trench in the first p-well 110 by a suitable selective growth process, for example, epitaxy. The silicon germanium layer may fill up the trench. The silicon germanium layer may be doped by a suitable p-type dopant, for example, boron, gallium, or indium, thereby forming the p-doped silicon germanium region 308. In one embodiment, the p-doped silicon germanium region 308 may have a higher dopant concentration than the first p-well 110. The sacrificial silicon dioxide layer may subsequently be removed. The tunnel dielectric 106 may be formed over a portion of the p-doped silicon germanium region 308, the first p-well 110 and the n-well 120. The floating gate 116 may be formed over the tunnel dielectric 106. Halo regions 138a and 138b may be formed in the first p-well 110. The halo region 138a may at least partially overlap a portion of the p-doped silicon germanium region 308 and may be adjacent to the other portion of the p-doped silicon germanium region 308. The spacer structures 112 may be formed over side surfaces of the tunnel dielectric 106 and the floating gate 116. The formation of the tunnel dielectric 106, floating gate 116, halo regions 138a and 138b, and spacer structures 112 of the nonvolatile memory device 300 may be like the fabrication process of the same features of the nonvolatile memory device 100.

The process continues to form the nonvolatile memory device 300 shown in FIG. 3. Referring to FIG. 3, the n+ doped regions 102c and 102d may be formed in the n-well 120 adjacent the floating gate 116. The source 102a may be formed in the first p-well 110 and adjacent to the p-doped silicon germanium region 308. The source 102a and a portion of the p-doped silicon germanium region 308 may be adjacent to and laterally displaced from the first side 136a of the floating gate 116. The drain 102b may be formed in the first p-well 110, adjacent to and laterally displaced from the second side 136b of the floating gate 116 opposite to the source 102a and spaced from the p-doped silicon germanium region 308. The formation of the n+ doped regions 102c and 102d, the source 102a and the drain 102b of the nonvolatile memory device 300 may be like the fabrication process of the same features of the nonvolatile memory device 100.

Figure 8:
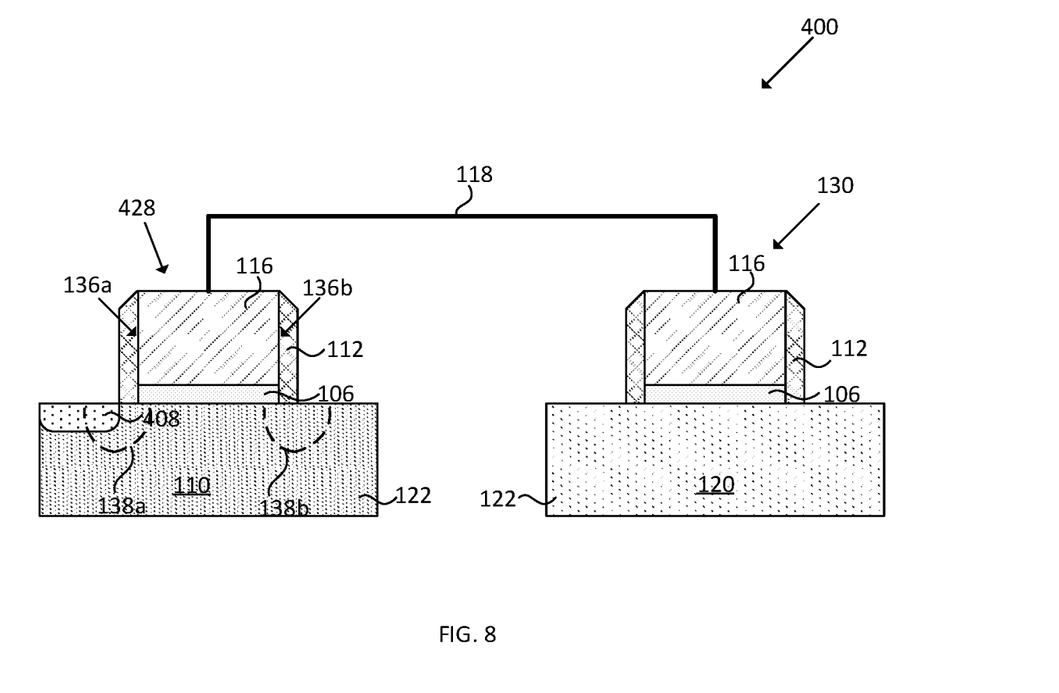
FIG. 8 illustrates a cross-section view of a partially completed nonvolatile memory device after formation of the first p-well, the n-doped silicon germanium region, the n-well, the tunnel dielectric, the floating gate, the halo regions, and spacer structures, according to some embodiments of the disclosure.

FIG. 8 illustrates a cross-section view of a partially completed nonvolatile memory device 400 after formation of the first p-well 110, the n+ doped silicon germanium region 408, the n-well 120, the tunnel dielectric 106, the floating gate 116, the halo regions 138a and 138b, and spacer structures 112, according to some embodiments of the disclosure. Referring to FIG. 8, the first p-well 110 and the n-well 120 may be formed in different portions of the substrate 122. The formation of the first p-well 110 and the n-well 120 of the nonvolatile memory device 400 may be like the fabrication process of the same features in the nonvolatile memory device 100. The n+ doped silicon germanium region 408 may be formed in an upper portion of the first p-well 110. Similar to the formation of the p-doped silicon germanium region 308 for the nonvolatile memory device 300, the formation of the n+ doped silicon germanium region 408 may include forming a layer of silicon germanium in the upper portion of the first p-well 110. The silicon germanium layer may be doped with a suitable n-type dopant, for example phosphorus, arsenic, or antimony, to thereby form n+ doped silicon germanium region 408. Subsequently, the tunnel dielectric 106 may be formed over the first p-well 110 and the n-well 120. The floating gate 116 may be formed over the tunnel dielectric 106. The n+ doped silicon germanium region 408 may be adjacent to and laterally displaced from the first side 136a of the floating gate 116 and a side surface of the tunnel dielectric 106. Halo regions 138a and 138b may be formed in the first p-well 110. The halo region 138a may be adjacent to a portion of the n+ doped silicon germanium region 408 and may at least partially overlap the other portion of the n+ doped silicon germanium region 408. Spacer structures 112 may be formed over side surfaces of the tunnel dielectric 106 and the floating gate 116. The formation of the tunnel dielectric 106, floating gate 116, halo regions 138a and 138b, and spacer structures 112 of the nonvolatile memory device 400 may be like the formation of the same features of the nonvolatile memory device 100.

The process continues to form the nonvolatile memory device 400 shown in FIG. 4. Referring to FIG. 4, the source 102a may be formed below the n+ doped silicon germanium region 408 and laterally displaced from the first side 136a of the floating gate 116. The drain 102b may be formed laterally displaced from the second side 136b of the floating gate 116 and opposite to the source 102a. The formation of the source 102a and the drain 102b of the nonvolatile memory device 400 may be like the formation of the same features of the nonvolatile memory device 100.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:
1. A nonvolatile memory device comprising:
a floating gate over a first p-well in a substrate;
an n-doped source, an n-doped drain, and a doped region in the first p-well, wherein the doped region is at least partially under the floating gate and adjacent to one of the source and the drain and spaced from the other of the source and the drain; and
halo regions adjacent to the source and the drain, wherein the doped region overlaps one of the halo regions adjacent to the source and the drain.

2. The nonvolatile memory device of claim 1, wherein the doped region is p-doped.

3. The nonvolatile memory device of claim 1, wherein the halo regions are p-doped.

4. A nonvolatile memory device comprising:
a floating gate over a first p-well in a substrate;
an n-doped source, an n-doped drain, and a doped region in the first p-well, wherein the doped region is at least partially under the floating gate, p-doped, and adjacent to the drain and spaced from the source; and
halo regions adjacent to the source and the drain, wherein the doped region overlaps the halo region adjacent to the drain.

5. The nonvolatile memory device of claim 2, wherein the doped region is adjacent to the source and spaced from the drain.

6. The nonvolatile memory device of claim 4, wherein the doped region is a second p-well with a higher dopant concentration than the first p-well.

7. The nonvolatile memory device of claim 4, wherein the doped region is a p-doped halo region having a higher dopant concentration than the first p-well.

8. The nonvolatile memory device of claim 5, wherein the doped region is made of silicon germanium (SiGe).

9. The nonvolatile memory device of claim 6, wherein a portion of the second p-well extends beyond and is deeper than the halo region adjacent to the drain.

10. A nonvolatile memory device comprising:
a first portion of a floating gate over a first p-well in a substrate;
an n-doped source, an n-doped drain, halo regions adjacent to the n-doped source and the n-doped drain, and a doped region in the first p-well, wherein the doped region is adjacent to a top surface of the first p-well between the n-doped source and the n-doped drain; and
a capacitor on the substrate, the capacitor comprising a second portion of the floating gate over a capacitor doped well in the substrate, a dielectric layer between the second portion of the floating gate and the capacitor doped well, and capacitor doped regions in the capacitor doped well, wherein the first portion of the floating gate is coupled to the second portion of the floating gate.

11. The nonvolatile memory device of claim 10, wherein the doped region is adjacent to the drain and spaced from the source.

12. The nonvolatile memory device of claim 10, wherein the doped region is adjacent to the source and spaced from the drain.

13. The nonvolatile memory device of claim 11, wherein the doped region is a second p-well and is arranged below a portion of the floating gate.

14. The nonvolatile memory device of claim 12, wherein the doped region is made of silicon germanium.

15. The nonvolatile memory device of claim 14, wherein the doped region is p-doped and is arranged below a portion of the floating gate.

16. The nonvolatile memory device of claim 14, wherein the doped region is arranged above the source.

17. The nonvolatile memory device of claim 16, wherein the doped region is n-doped and has at least the same dopant concentration as the source.

18. A method of fabricating a nonvolatile memory device, the method comprising:
forming a doped region in a first p-well in a substrate;
forming a floating gate over the first p-well, wherein the doped region is at least partially under the floating gate;
forming an n-doped source and an n-doped drain in the first p-well, wherein the doped region is adjacent to one of the source and the drain and spaced from the other of the source and the drain; and
forming halo regions adjacent to the source and the drain, wherein the doped region overlaps one of the halo regions adjacent to the source and the drain.

19. The method of claim 18, wherein forming the doped region further comprises:
forming a second p-well in the first p-well in the substrate.

20. The method of claim 19, wherein forming the n-doped drain further comprises:
forming the n-doped drain in the second p-well, wherein the drain is adjacent to the second p-well.

21. A method of fabricating a nonvolatile memory device, the method comprising:
forming a doped region in a first p-well in a substrate;
forming a first portion of a floating gate over the first p-well and a second portion of the floating gate over a capacitor doped well in the substrate, wherein the first portion of the floating gate is coupled to the second portion of the floating gate;
forming an n-doped source and an n-doped drain in the first p-well, wherein the doped region is adjacent to a top surface of the first p-well between the n-doped source and the n-doped drain;
forming halo regions adjacent to the n-doped source and the n-doped drain; and
forming a capacitor on the substrate, including forming a dielectric layer between the second portion of the floating gate and the capacitor doped well and forming capacitor doped regions in the capacitor doped well.

* * * * *